United States Patent [19]

Huang

[11] 4,040,168

[45] Aug. 9, 1977

[54] FABRICATION METHOD FOR A DUAL GATE FIELD-EFFECT TRANSISTOR

[75] Inventor: Ho-Chung Huang, Princeton, N.J.

[73] Assignee: RCA Corporation, New York, N.Y.

[21] Appl. No.: 634,517

[22] Filed: Nov. 24, 1975

[51] Int. Cl.² .............................................. B01J 17/00
[52] U.S. Cl. ....................................... 29/571; 29/578; 29/579; 357/15; 357/22
[58] Field of Search ..................... 29/571, 576 B, 579, 29/578; 357/15, 22, 23

[56] References Cited

U.S. PATENT DOCUMENTS

| 3,258,898 | 7/1966 | Garibotti | 29/576 B |
|---|---|---|---|
| 3,634,702 | 1/1972 | Drangeid | 357/22 |
| 3,675,313 | 7/1972 | Driver | 29/571 |
| 3,714,523 | 1/1973 | Bate | 357/23 |
| 3,861,024 | 1/1975 | Napoli | 29/579 |
| 3,931,674 | 1/1976 | Amelio | 29/578 |

Primary Examiner—W. Tupman

Attorney, Agent, or Firm—H. Christoffersen; R. P. Williams; W. L. Muckelroy

[57] ABSTRACT

A method for fabricating a semiconductor device having a pair of laterally spaced metal contacts adjacent a source and a drain, respectively, both contacts being located on a principal surface of a monocrystalline semiconductor, the contacts being separated by a groove therebetween. An edge of each of the contacts is extended in a cantilevered fashion over the groove, and a channel for the semiconductor is located under the groove. First and second laterally spaced Schottky-barrier gates are located in the groove adjacent the channel. In the method, the two Schottky-barrier gates are formed by deposition of a wide single gate onto a principal flat surface of the groove. The wide single gate is divided lengthwise into two separate Schottky-barrier gate conducting means by removing a portion of the gate through a photolithographically defined slot in a layer of a resistant means such as a photoresist or an ion-beam resist.

1 Claim, 9 Drawing Figures

FABRICATION METHOD FOR A DUAL GATE FIELD-EFFECT TRANSISTOR

The present invention relates to a method for fabricating a metal-semiconductor-field-effect-transistor (MESFET) having two control gates. More particularly, the present invention relates to a method for fabricating a semiconductor device having, on an epitaxial body of a semiconductor material, a source and a drain contact adjacent a source and a drain, respectively, one each of which is located on either side of a groove above a channel, the contacts extending over the groove in cantilever fashion, and at least two Schottky-barrier metal films or gates located in the groove above the channel.

It is known to fabricate dual gate field-effect transistors by shadow evaporation at varied changes from elevated sources. In this method, a vertical step is first etched in a layer of epitaxially grown semiconductor. A metal layer is then deposited on top of the semiconductor such that the previously formed vertical step acts as a shadow mask and prevents a portion of a principal surface of the semiconductor adjacent the step from being covered with the metal. Another metal layer is then deposited from an opposite angular position chosen so that an edge of the first metal layer deposited on a lower portion of the semiconductor acts as a shadow mask. These two depositions create an aperture in the metal layers at the vertical step. The aperture extends along an entire length of the vertical step and by etching the semiconductor through this aperture a groove with pyramidally splayed sidewalls is formed. The Schottky-barrier gates are electrically isolated by deposition of the first Schottky metal from an angle onto a position at the bottom of the groove, completely beneath an uppermost cantilevered strata of metal, and removing a part of this metal at an end away from its contact by etching with a suitable etchant such that the end is completely underneath the cantilevered strata, while masking the contact. The second Schottky metal is deposited for the second gate from a position substantially above the aperture formed by the cantilevered metallizations whereby the first Schottky metal and strata are suitable protected with photoresist.

It is also known to form multiple gate field-effect transistors using a so-called "liftoff" method. In this method a layer of metal is disposed adjacent a semiconductor substrate. An aperture above a channel is photolithographically defined in the layer of metal. The aperture comprises a space above the channel and metal portions on each side of the aperture comprise the source and drain contacts. A layer of photoresist is deposited such that the layer is disposed adjacent the metal and in the aperture. A pattern of strips is defined photolithographically in the layer of photoresist which is the negative of the desired pattern for the gates to be formed in the aperture. A layer of metal, such as aluminum, is deposited over the entire principal surface of the device whereby metal becomes deposited and interdigitated between the strips of photoresist in the aperture. Two strips of photoresist are each adjacent a vertical wall of the aperture and multiple gates within the aperture and adjacent the channel are formed by dissolving the photoresist and thereby causing metallization thereabove to collapse and break away. The metal gates remain in those regions where the metal has contacted the semiconductor substrate or a layer of metallization.

One problem associated with prior art devices has been low yields resulting from a use of the above-described methods for producing these devices. Another problem in the production of prior art devices is a characteristically long channel transit length, usually in excess of 8 microns, which limits the high frequency performance of the device. Low yields or complicated methods make devices inordinately expensive and useful only as research novelties.

Figure 1:
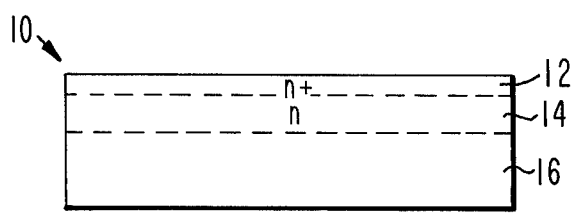
FIGS. 1–8 show, sequentially, aspects of the principal steps of the present novel invention.

In FIG. 1 is shown a work piece 10 comprised of an N+ layer 12 having a resistivity of $10^{-4}$ ohm-cm, for example, and doped to approximately $2 \times 10^{18}$ atoms per cc, for example. The layer 12 is adjacent an N layer 14 having a doping density of about $8 \times 10^{16}$ atoms per cubic cm, for example. Adjacent the N layer 14 is a semi-insulating layer 16 of gallium arsenide having a resistivity of $10^5$ to $10^7$ ohm-cm, for example, doped with chromium, for example.

Figure 2:
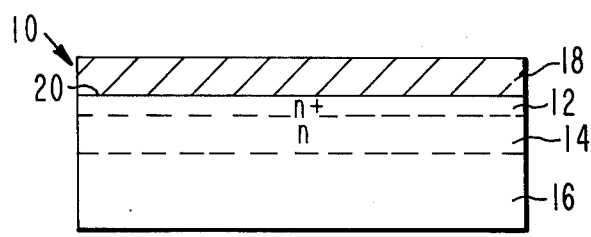
Figure 3:
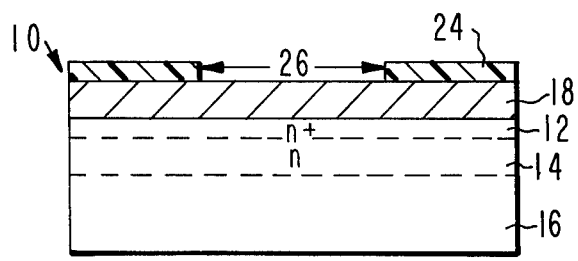

As shown in FIG. 2 a metal layer 18 is disposed adjacent a principal surface 20 of the work piece 10 (also a principal of the N+ layer 12). An aperture 22 (FIG. 4) is defined in the layer 18 by apposition of a photoresist layer 24 (FIG. 3) with a photolithographically defined longitudinal slot 26 therein adjacent the metal layer 18. The layer 18, comprised of successive layers of titanium-palladium-gold, for example, is removed from the aperture 26 by suitable means, such as an ion beam milling at 0.6 keV, for example, in an ion microetch machine 28 such as a "Veeco" system, for example. Similarly, an aperture 30 in the N+ layer 12 is defined by a suitable removing means, for example, ion beam milling 0.6 keV, for example, on the Veeco microetch system, for example. In the course of ion beam milling the apertures 22 and 30, the photoresist layer 24 is removed.

In one practical embodiment of the invention, the N+ layer 12 is 0.5 $\mu$m thick, the N layer 14 is 0.3 $\mu$m thick and the semi-insulating layer 16 is 125 $\mu$m thick. In addition, the thickness of the metal layer 18 in this example is approximately 0.5 $\mu$m, for example. The Veeco microetch system, set at 0.6 keV, etches the metal layer 18 at the rate of 0.05 $\mu$m per minute and accordingly, in the aforedescribed embodiment, the aperture 22 is formed after approximately 10 minutes. Moreover, the above-mentioned ion beam milling for the N+ layer 12 etches at a rate of 0.05 $\mu$m per minute. Accordingly, the work piece 10 is removed from the Veeco system after a duration of 20 minutes.

Figure 4:
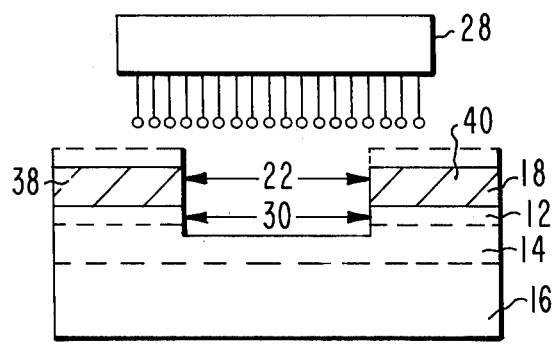

Thereafter, overhanging portions 32 of the layers 18 are produced by enlarging the aperture 30 for the layer 12. The aperture 30 is initially coincident with a blind aperture 34 of the N layer 14. A means for producing the overhanging portions 32 and maintaining the blind aperture 34 in the layer 14 as shown in FIG. 4, is an etchant comprised of hydrofluoric acid such as 3 drops of HF::45 ml deionized $H_2O$::10 ml concentrated $H_2O_2$, unstabilized.

In one practical example, the apertures 22 and 30 are approximately 4 $\mu$m wide. It is preferable that Schottky-barrier metal gates for controlling an electron transit channel, coincidently oriented beneath the aperture 30 but within the layer 14, be deposited adjacent a principal flat surface 36 of the layer 14 and yet be isolated from source and drain contacts 38 and 40 formed from the layer 18.

Figure 5:
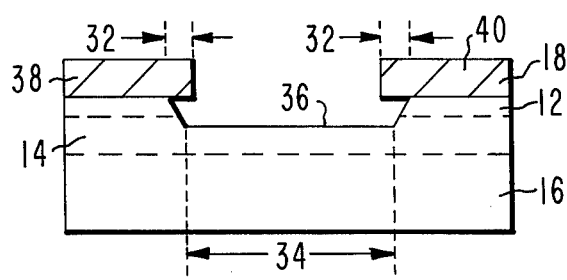

In FIG. 5, source and drain contacts 38 and 40 are utilized as an etch mask to provide the controlled overhanging portion 32 whereby a portion of each contact 38 and 40 is cantilevered above an exposed principal flat surface 36 of the layer 14. The controlled overhanging portions 32 are produced by chemically etching the layers 12 and 14 with the above-described etchant for approximately 20 seconds. This etchant produces an overhang of the source and drain contacts 38 and 40 at the rate of 0.02 μm per second.

Figure 6:
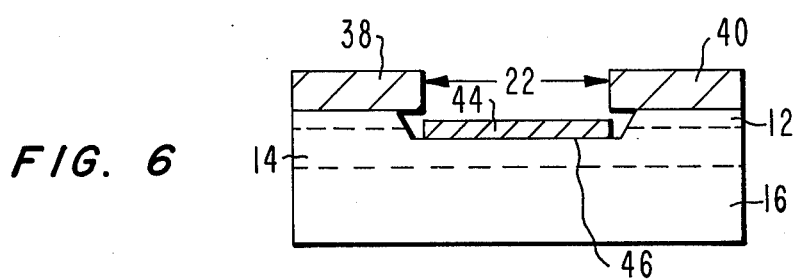

FIG. 6 shows a Schottky metal gate 44 or Schottky gate means deposited onto a surface 46 of an electron transit channel through the aperture 22 formed by the source and drain contacts 38 and 40. The Schottky metal gate 46 contiguously contacts the surface 46 of the electron transit channel and may be comprised of, a system of titanium-palladium-gold, for example. The metal system may be deposited using known techniques such as vacuum evaporation, sputtering, or electroplating. See, for example, U.S. Pat. No. 3,657,029 issued to Fuller, Apr. 18, 1972. Such titanium-palladium-gold systems are well-known in this art and are widly used for gate, source, and drain contacts.

The aperture 22 defines the width and lateral dimension of the wide gate 46.

Figure 7:
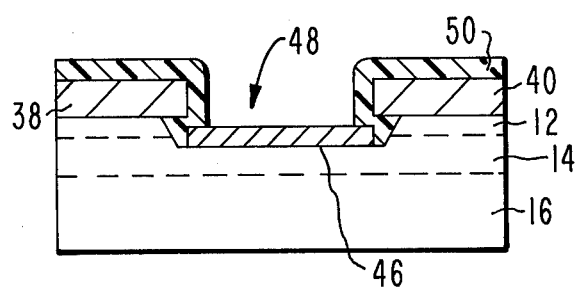
Figure 8:
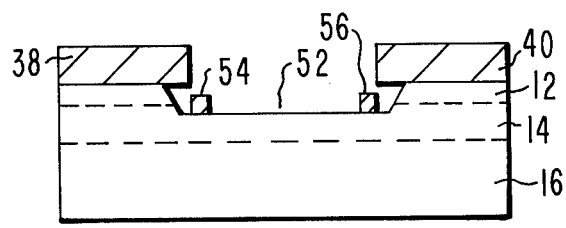

In FIG. 7, the gate 46 is divided or split to form two disjoined portions according to a slot 48 photolithographically defined in a layer 50 of photoresist deposited adjacent source and drain contacts 38 and 40, and into the space above the channel around the wide gate 46. A structure, such as shown in FIG. 8, is produced by etching or ion beam milling a slit 52 in the wide gate 46 to produce two single and disjoined gates 54 and 56. When ion beam milling the slit 52, it is preferable to insure that the layer 50 is of a suitable ion beam resistant material, for example, silicon dioxide. The slit 52 when 3 μm wide provides two gates 54 and 56 each having a width of 0.5 μm, for example, from a 4 μm wide gate 46.

Figure 9:
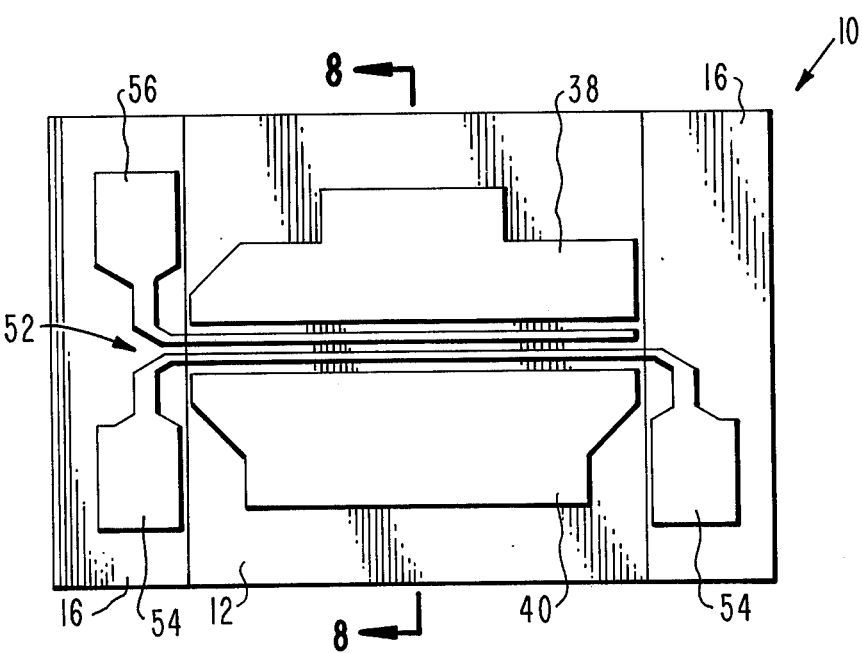
FIG. 9 is a top view of a field-effect transistor fabricated using the method of the present novel invention.

FIG. 9 is a plan view of the device shown in cross-section in FIG. 8. There is shown the gates 54 and 56 with their respective contacts, the slit 52 and the source and drain contacts 38 and 40.

We claim:

1. In a method for making a dual gate field effect transistor comprising the steps of:
   disposing a layer of a conductor adjacent a surface of an N+ layer of a semiconductor substrate;
   forming an aperture in the conductor;
   forming an aperture in the N+ layer congruent with the aperture in the conductor;
   forming a blind aperture in an N layer adjacent the N+ layer congruent with the aperture in the N+ layer;
   enlarging the aperture formed in the N+ and N layers whereby the conductor is cantilevered over the apertures in the N+ and N layers;
   forming two disjoined contacts from said conductor separated by the apertures; and
   disposing a Schottky metal adjacent a principal flat surface of the blind aperture in the N layer via the aperture defined by the conductor;
   the improvement comprising the steps of:
   disposing a layer of photoresist over the exposed surfaces of the disjoined contacts, the metal and the N+ and N layers;
   removing a portion of the photoresist to expose a central region of the Schottky metal located transversely between the disjoined contacts whereby each end region of the metal is located adjacent one of said disjoined contacts and remains covered with a continuously extending portion of said photoresist;
   removing the central region of the metal using said photoresist as a mask whereby two laterally spaced Schottky metal gates are formed; and
   removing the photoresist remaining.

\* \* \* \* \*